(12) United States Patent
Kobayashi et al.

(10) Patent No.: US 8,937,572 B2
(45) Date of Patent: Jan. 20, 2015

(54) SIGNAL GENERATOR, OSCILLATOR, AND RADAR DEVICE

(75) Inventors: Yuka Kobayashi, Tokyo (JP); Hiroki Sakurai, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 284 days.

(21) Appl. No.: 13/544,286

(22) Filed: Jul. 9, 2012

(65) Prior Publication Data

US 2013/0050013 A1 Feb. 28, 2013

(30) Foreign Application Priority Data

Aug. 29, 2011 (JP) ................ P2011-185519

(51) Int. Cl.
*G01S 13/34* (2006.01)
*H03L 7/08* (2006.01)
*H03L 7/093* (2006.01)
*G01S 13/58* (2006.01)

(52) U.S. Cl.
CPC .............. *H03L 7/093* (2013.01); *G01S 13/343* (2013.01); *G01S 13/584* (2013.01); *H03L 2207/10* (2013.01)
USPC .............. 342/199; 342/103; 342/175; 331/25

(58) Field of Classification Search
USPC ....................................................... 342/199
See application file for complete search history.

(56) References Cited

U.S. PATENT DOCUMENTS

| 4,593,287 | A | 6/1986 | Nitardy |
| 6,114,987 | A | 9/2000 | Bjornholt |
| 7,898,344 | B2 | 3/2011 | Hongo |
| 8,284,099 | B2* | 10/2012 | Sakurai .................. 342/200 |
| 2003/0219085 | A1* | 11/2003 | Endres et al. ................ 375/350 |
| 2010/0245160 | A1 | 9/2010 | Sakurai et al. |
| 2011/0227785 | A1 | 9/2011 | Sakurai |
| 2012/0319889 | A1* | 12/2012 | Kobayashi et al. ........... 342/118 |

FOREIGN PATENT DOCUMENTS

| JP | 2008-072257 A | 3/2008 |
| JP | 2008-224350 A | 9/2008 |

* cited by examiner

*Primary Examiner* — Matthew M Barker
(74) *Attorney, Agent, or Firm* — Holtz, Holtz, Goodman & Chick PC

(57) ABSTRACT

A signal generator of an embodiment has an oscillator to generate an oscillation signal controlled in frequency by an analog control signal; a digital phase detector; a first differentiator; and a comparator outputting digital frequency error information. The generator includes a second differentiator differentiating the frequency setting code to generate a gain value and an inverse number of the gain value; a first multiplier multiplying the digital frequency error information by the gain value, a low-pass filter removing a high frequency component in a multiplication result, and a second multiplier multiplying an output of the low-pass filter by the inverse number. The generator includes a D/A converter converting a multiplication result into analog frequency error information, and an integrator converting the analog frequency error information into analog phase error information to output the analog phase error information as the analog control signal.

20 Claims, 13 Drawing Sheets

SIGNAL GENERATOR, OSCILLATOR, AND RADAR DEVICE

CROSS REFERENCE TO RELATED APPLICATION

This application is based upon and claims the benefit of priority from the prior Japanese Patent Application No. 2011-185519, filed on Aug. 29, 2011; the entire contents of which are incorporated herein by reference.

FIELD

Embodiments described herein relate generally to a signal generation circuit (signal generator), an oscillator, and a radar device.

BACKGROUND

A radar device using an FMCW (Frequency Modulated Continuous Wave) signal receives the FMCW signal transmitted from a transmitter and reflected by an object, and multiplies the reception signal by a transmission signal transmitted at the reception time. Here, the output frequency of the multiplier is decided by the time difference between the signals, so that the distance to the object, the relative speed and so on can be obtained.

The FMCW signal for a radar is required to have characteristics that its frequency almost linearly varies with respect to time. There is a conventionally known method in which the frequency of the output signal from a voltage-controlled oscillator is converted into voltage and compared with a voltage signal in a triangular wave shape inputted from an external part, and the error (difference) between them is used to obtain high linearity. There is another known method in which the sensitivity of the voltage-controlled oscillator converting voltage into frequency is measured using a phase synchronization circuit and a variable frequency divider, a signal with the non-linearity of the voltage-controlled oscillator corrected based on the sensitivity is generated, and the voltage-controlled oscillator is controlled by the correction signal with the phase synchronization circuit opened, to generate the FMCW signal with high linearity. There is still another known method in which the frequency of a reference signal in a triangular wave is multiplied using a phase synchronization circuit with a narrow loop bandwidth, and the multiplied signal is used as a reference signal for a phase synchronization circuit with a wide loop bandwidth.

DETAILED DESCRIPTION

However, the conventional method has a problem in which it is difficult to suppress the phase noise of the voltage-controlled oscillator and keep the linearity of the FMCW signal and therefore it is necessary to separately provide means for correcting an error. Objects of a signal generation circuit, an oscillator and a radar device of embodiments are to provide a signal generation circuit (signal generator), an oscillator and a radar device capable of obtaining an FMCW signal with low noise, high frequency accuracy and high linearity.

To solve the above problem, a signal generation circuit (signal generator) of an embodiment has an oscillator in which a frequency of an oscillation signal thereof is controlled by an analog control signal. The signal generation circuit includes a digital phase detector to detect phase information of the oscillation signal to output digital phase information, a first differentiator to differentiate the digital phase information to output digital frequency information, and a comparator to compare a frequency setting code used for setting the oscillation frequency with the digital frequency information to output digital frequency error information. The signal generation circuit further includes a second differentiator to differentiate the frequency setting code to generate a gain value corresponding to a slope of the frequency setting code and an inverse number of the gain value, a first multiplier to multiply the digital frequency error information outputted from the comparator by the gain value, a low-pass filter to remove a high frequency component in a result of multiplication by the first multiplier, and a second multiplier to multiply an output of the low-pass filter unit by the inverse number of the gain value. The signal generation circuit further includes a D/A converter to convert a result of multiplication by the second multiplier into analog frequency error information, and an integrator to integrate the analog frequency error information to convert the analog frequency error information into analog phase error information to output the analog phase error information as the analog control signal.

First Embodiment

Figure 1:
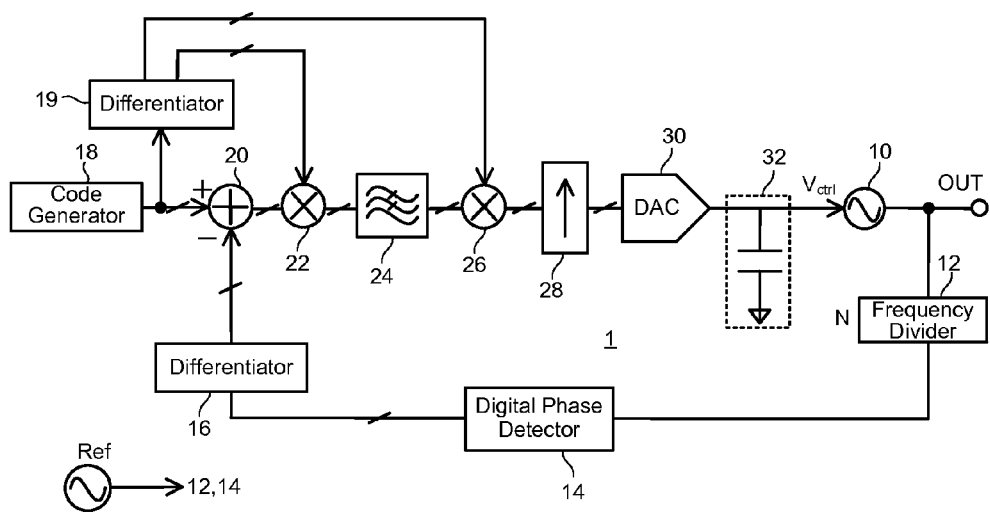
FIG. 1 is a block diagram illustrating a configuration of a signal generation circuit of a first embodiment.

Hereinafter, a signal generation circuit of a first embodiment will be described in detail referring to FIG. 1 to FIG. 5. As illustrated in FIG. 1, a signal generation circuit 1 according to the first embodiment includes a voltage-controlled oscillator 10 (VCO 10) whose oscillation frequency varies according to an analog control voltage, a frequency divider 12 to divide the frequency of an output signal of the VCO 10 by a predetermined frequency division number N, a digital phase detector 14 to detect phase information from the output signal of the frequency divider 12 to output digital phase information, and a differentiator 16 to differentiate the digital phase information outputted from the digital phase detector 14 to convert it into digital frequency information.

The signal generation circuit 1 of the embodiment further includes a code generator 18 to generate a predetermined frequency setting code, a comparator 20 (subtractor) to compare the digital frequency information outputted from the differentiator 16 with the frequency setting code generated by the code generator 18 to output digital error information, a current output DA converter 30 (current output DAC 30) to convert the digital error information into analog error information to output the analog error information as an analog current, and an integrator 32 to integrate the output current of the current output DAC 30 to generate a control voltage for the VCO 10.

The signal generation circuit 1 of the embodiment further includes a differentiator 19 to differentiate the frequency setting code generated by the code generator 18 to generate a gain value corresponding to the slope of the frequency setting code and a value of an inverse number of the gain value, a multiplier 22 to multiply the digital frequency error information outputted from the comparator 20 by the gain value generated by the differentiator 19, a low-pass filter 24 (LPF 24) to suppress the high frequency component contained in a result of the multiplication by the multiplier 22, and a multiplier 26 to multiply the output of the LPF 24 by the inverse number of the gain value generated by the differentiator 19 to supply the obtained digital error information to the current output DAC 30.

Note that the signal generation circuit 1 of the embodiment may include a variable gain amplifier 28 (or a variable attenuator) amplifying (or attenuating) the output of the LPF 24.

The VCO 10 generates an FMCW signal having characteristics that its frequency linearly varies with respect to time based on a control voltage $V_{ctrl}$. The frequency divider 12 divides the frequency of the oscillation signal of the VCO 10 by a predetermined frequency division ratio N. Generally, the limit of direct detection of the phase of the signal by the digital phase detector is a frequency of about several GHz. Hence, the frequency divider 12 decreases the frequency of the oscillation signal of the VCO 10 to the extent that the digital phase detector can detect its phase. For example, when the oscillation signal of the VCO 10 is used as the FMCW signal of a millimeter wave radar of a 77 GHz band, the frequency divider 12 divides the frequency of the oscillation signal into 32 to thereby convert the oscillation signal to signals with a frequency of about 2.4 GHz.

The digital phase detector 14 detects the phase information of the output signal of the frequency divider 12 in each cycle of a reference signal Ref of the system and outputs the phase information as a digital code. The digital phase detector 14 can be realized, for example, by a counter circuit to count and outputting the number of pulses of the inputted signal, a time-to-digital converter (TDC) to detect the time difference between the rising edge of the inputted signal and the rising edge of the reference signal Ref so as to output the time difference as a digital code, or a combination of them.

The differentiator 16 differentiates the digital phase information outputted from the digital phase detector 14 to thereby convert the digital phase information to digital frequency information.

The code generator 18 generates a digital signal having a value corresponding to the frequency variation of the oscillation signal of the VCO 10 with respect to time to output the digital signal as a frequency setting code. The frequency setting code has a variation of the value corresponding to the frequency variation to be oscillated by the VCO 10, and varies, for example, in a triangular wave or saw-tooth wave shape. In other words, if the gain of a negative-feedback loop of the circuit illustrated in FIG. 1 is sufficiently high, the frequency information outputted from the differentiator 16 varies following the frequency setting code, so that the output frequency of the VCO 10 also varies in a triangular wave or saw-tooth wave shape as with the frequency setting code.

The differentiator 19 differentiates the frequency setting code generated by the code generator 18 to generate the value (gain value) corresponding to the slope of the frequency setting code. In addition, the differentiator 19 also generates the value of the inverse number of the generated gain value. For example, when the frequency setting code is an triangular wave in which the slope repeats "1" and "−1", the differentiator 19 will alternately output "1" and "−1".

The comparator 20 calculates the difference between the frequency setting code generated by the code generator 18 and the frequency information outputted from the differentiator 16 so as to output the difference as error information. The multiplier 22 multiplies the digital error information outputted from the comparator 20 and the gain value generated by the differentiator 19 together and supplies the multiplication result to the LPF 24. The LPF 24 is a filter removing the high frequency component contained in the multiplication result by the multiplier 22 and functions as an LPF of a PLL circuit. The multiplier 26 multiplies the output of the LPF 24 and the inverse number of the gain value generated by the differentiator 19 together and supplies the multiplication result to the variable gain amplifier 28. In short, the error information outputted from the comparator 20 is converted into a constant value by the multiplier 22 and then supplied to the LPF 24, passed through the LPF 24, and then restored to the original error information by the multiplier 26.

The variable gain amplifier 28 performs amplification or attenuation processing so that the amplitude component of the error information restored by the multiplier 26 becomes a predetermined level. The variable gain amplifier 28 may be omitted.

The current output DAC 30 converts the digital error signal outputted from the multiplier 26 into an analog error signal to output the analog error signal as an analog current. The integrator 32 is composed of, for example, a capacitor and the like and acts to convert the current outputted from the current output DAC 30 into voltage. The voltage obtained by conversion by the integrator 32 is supplied to the VCO 10 as the control voltage $V_{ctrl}$.

Note that the current output DAC can also be realized by a voltage output DAC. In this case, it is only necessary that the integrator 32 may be composed of an analog voltage integrator composed of an operation amplifier circuit, a resistor, and a capacitor and its output is the control voltage for the VCO 10.

In the case where the error information outputted from the comparator 20 is a constant and positive value, a constant current flows into the capacitor constituting the integrator 32, so that the control voltage $V_{ctrl}$ increasing at a constant rate with respect to time can be obtained. As a result, the VCO 10 generates an oscillation signal monotonously increasing in frequency with respect to time.

The calculation of each element from the digital phase detector 14 to the current output DAC 30 is calculation of digital information (digital signal) and is realized by using digital circuits. Therefore, the elements affecting the linearity of the oscillation frequency of the VCO 10 are realized by digital processing, so that analog passive elements such as a resistor and a capacitor become unnecessary, resulting in improved stability of the circuits and the FMCW signal. Further, since errors due to the element variation in the passive elements and the like do not occur, highly accurate calculation can be realized.

Note that the elements down to the integrator 32 can also be realized by digital circuits. In this case, it is only necessary to convert the integrated digital code into an analog control voltage by a voltage output DA converter or to directly control a digitally controlled oscillator (DCO) by using the integrated digital code.

However, when the signal generation circuit 1 of the embodiment is used for an FMCW radar, the control signal for the VCO needs to vary almost linearly with respect to time. In the case where the integrator 32 is realized by the analog circuit such as a capacitor as illustrated in FIG. 1, the current output digital-analog converter only needs to be configured to output current almost constant with respect to time and therefore can be realized at a relatively low operation speed. In other words, generation of the control voltage for the VCO by the current output DAC and the analog integrator in combination enables further reduction in power consumption and provision of an oscillation signal with suppressed distortion and with higher accuracy.

Principle of First Embodiment

Figure 2:
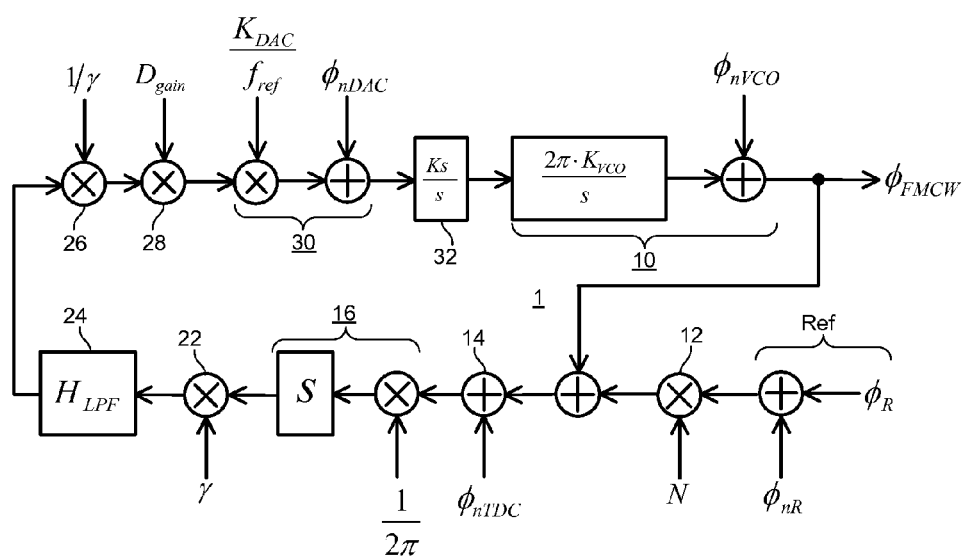
FIG. 2 is a block diagram illustrating transfer characteristics in the signal generation circuit of the first embodiment.

Subsequently, the principle of the signal generation circuit 1 of the first embodiment will be described referring to FIG. 2. FIG. 2 illustrates a transfer function of the signal generation circuit 1 illustrated in FIG. 1.

In FIG. 2, $\phi_{FMCW}$ is the phase noise of the FMCW signal, $\phi_R$ is the phase of the reference signal Ref, $\phi_{nR}$ is the phase noise of the reference signal, N is the frequency division number of the frequency divider 12, $\phi_{nTDC}$ is the quantization noise generated in the digital phase detector 14, γ is the gain of the multiplier 22, $H_{LPF}$ is the transfer function of the LPF 24, 1/γ is the gain of the multiplier 26, $D_{gain}$ is the gain of the variable gain amplifier 28, $K_{DAC}$ is the gain of the current output DAC 30, $\phi_{nDAC}$ is the quantization noise generated in the current output DAC 30, $K_S$ is the gain of the integrator 32, $f_{ref}$ is the frequency of the reference signal, $K_{VCO}$ is the gain of the VCO 10, and $\phi_{nVCO}$ is the phase noise generated in the VCO 10. An open loop transfer function $H_{OP}$ in FIG. 2 is expressed by Expression 1.

[Expression 1]

$$H_{op} = \frac{H_{LPF} \cdot D_{gain} \cdot K_{DAC} \cdot K_s \cdot K_{VCO}}{s} \quad (1)$$

Further, a noise transfer function $NTF_R$ from $\phi_{nR}$ to the output, a noise transfer function $NTF_{TDC}$ from $\phi_{nTDC}$ to the output, a noise transfer function $NTF_{DAC}$ from $\phi_{nDAC}$ to the output, and a noise transfer function $NTF_{VCO}$ from $\phi_{nVCO}$ to the output are expressed by Expressions 2 to 5 respectively.

[Expression 2]

$$NTF_R = N \cdot \frac{H_{OP}}{1 + H_{OP}} \quad (2)$$

[Expression 3]

$$NTF_{TDC} = \frac{H_{OP}}{1 + H_{OP}} \quad (3)$$

[Expression 4]

$$NTF_{DAC} = \frac{2\pi K_{VCO}/s^2}{1 + H_{OP}} \quad (4)$$

[Expression 5]

$$NTF_{VCO} = \frac{1}{1 + H_{OP}} \quad (5)$$

It is found that since $NTF_R$, $NTF_{TDC}$, $NTF_{DAC}$ indicate characteristics of a low-pass filter, $NTF_{VCO}$ indicates a characteristic of a high-pass filter, the high frequency components of the noises generated in the reference signal Ref, the digital phase detector 14, and the current output DAC 30 are suppressed, and the low frequency component of the noise generated in the VCO 10 is suppressed. In short, the signal generation circuit 1 forms a PLL loop.

Operation of First Embodiment

Subsequently, the operation of the signal generation circuit 1 of the first embodiment will be described referring to FIG. 1 to FIG. 5.

Figure 3:
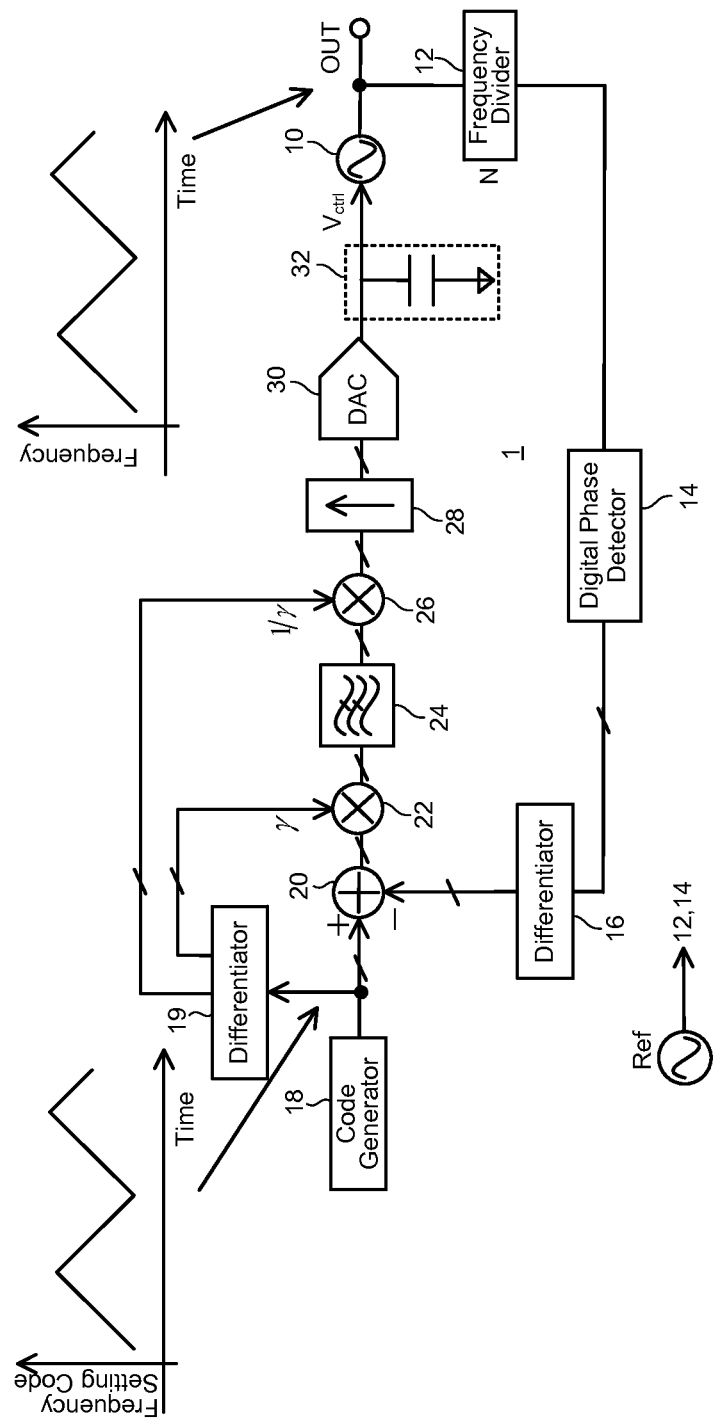
FIG. 3 is a block diagram illustrating a principle configuration of the signal generation circuit of the first embodiment.

As illustrated in FIG. 3, apart of the oscillation signal of the VCO 10 is subjected to frequency-division by the frequency divider 12 and sent to the digital phase detector 14. The digital phase detector 14 detects the phase information from the frequency-divided oscillation signal and sends digital phase information to the differentiator 16. The differentiator 16 converts the digital phase information into digital frequency information and supplies the digital frequency information to the comparator 20. The comparator 20 compares the frequency setting code generated by the code generator 18 with the digital frequency information and outputs digital error information.

On the other hand, the differentiator 19 supplies the gain value obtained by differentiating the frequency setting code generated by the code generator 18 to the multiplier 22 and supplies the inverse number of the gain value to the multiplier 26. Here, when the frequency setting code is a triangular wave whose slope repeats "1" and "−1" and the gain is "1" as illustrated in FIG. 3, the multiplier 22 multiplies the digital error information by "1" or "−1" and the multiplier 26 multiplies the digital error information by "1" or "−1".

The multiplier 22 multiplies the digital error information outputted from the comparator 20 by "1" or "−1". Since the polarity of the value that the multiplier 22 multiplies corresponds to the slope of the frequency setting code, the output of the multiplier 22 takes a constant value. The output of the multiplier 22 is supplied to the multiplier 26 via the LPF 24. The multiplier 26 multiplies the output of the LPF 24 by "1" or "−1". Since the polarity of the value that the multiplier 26 multiplies also corresponds to the slope of the frequency setting code, the output of the multiplier 26 is restored to the original digital error information.

The digital error information outputted from the multiplier 26 is sent to the current output DAC 30 via the variable gain amplifier 28. The current output DAC 30 converts the digital error information into analog error information and supplies a corresponding analog current to the integrator 32. The integrator 32 converts the supplied current into voltage and supplies the voltage to the VCO 10. As has been described, the signal generation circuit 1 forms the PLL loop, and the VCO 10 therefore generates the FMCW signal according to the frequency setting code generated by the code generator 18.

FIG. 3 illustrates that by supplying the triangular wave as the frequency setting code, a FMCW signal with a frequency of frequency $f_{ref} \times FCW \times N$ can be obtained.

Figure 4:
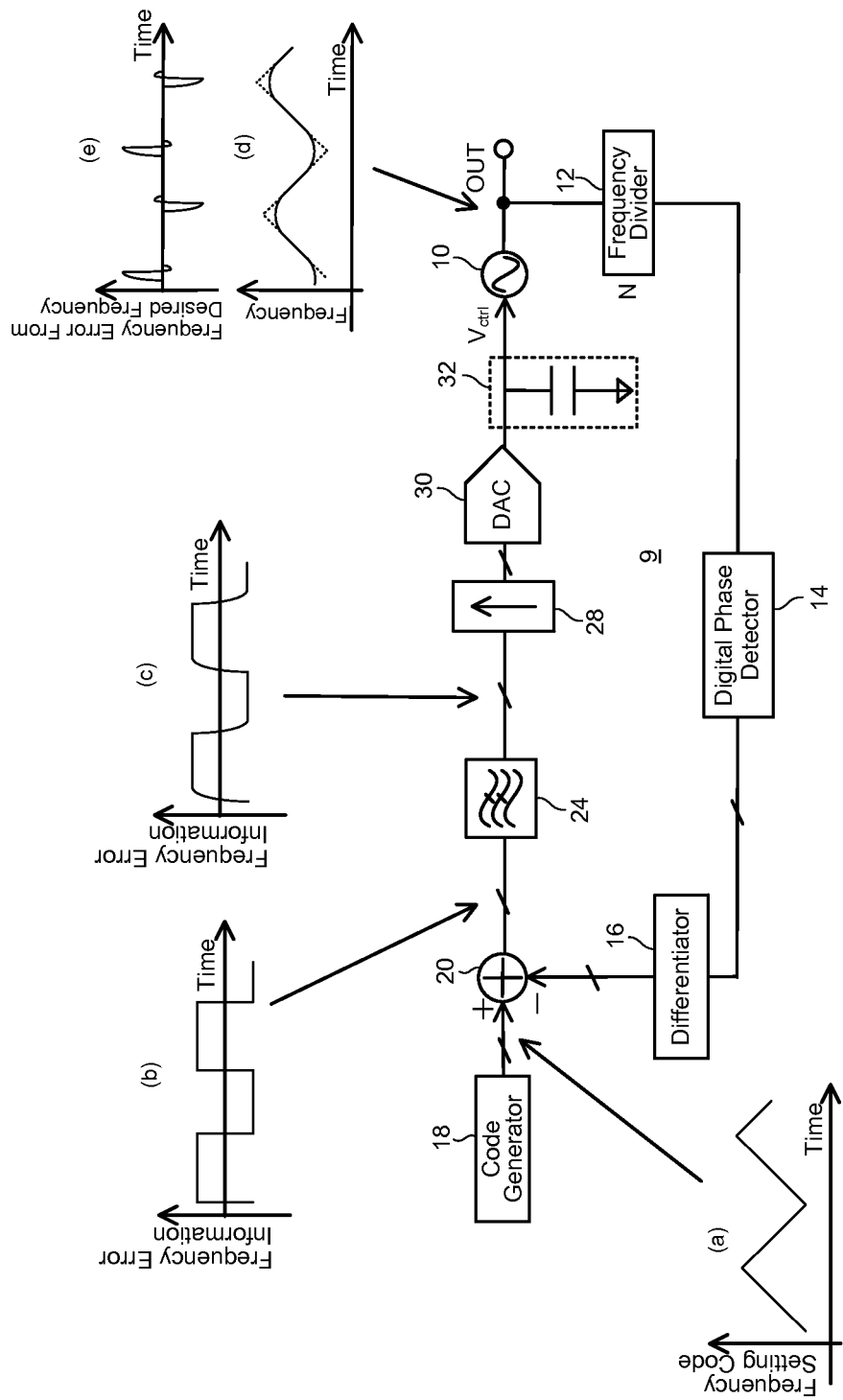
FIG. 4 is a diagram illustrating changes of frequency error information in a signal generation circuit of a comparative example.

Here, the working of the signal generation circuit of the first embodiment will be described referring to FIG. 4 and FIG. 5. FIG. 4 illustrates, as a comparative example, a signal generation circuit 9 having a configuration in which the differentiator 19 and the multipliers 22 and 26 are not provided, and FIG. 5 illustrates the signal generation circuit 1 of the embodiment.

As illustrated in FIG. 4, in the signal generation circuit 9 having the configuration in which the differentiator 19 and the multipliers 22 and 26 are not provided, when the code generator 18 generates the frequency setting code in a triangular wave shape ((a) in the drawing), the comparator 20 outputs the frequency error information in a rectangular wave shape ((b) in the drawing). Since the LPF 24 has transient response characteristics here and therefore causes delay in settling of the increasing and decreasing of the frequency error information varying in a rectangular wave shape ((c) in the drawing). In particular, the delay becomes conspicuous during the time when the slope of the frequency setting code varies most greatly (areas where the slope changes from positive to negative and from negative to positive), and the frequency error of the FMCW signal outputted from the VCO 10 (the deviation from the frequency variation of a desired FMCW signal) becomes large ((d), (e) in the drawing).

Figure 5:
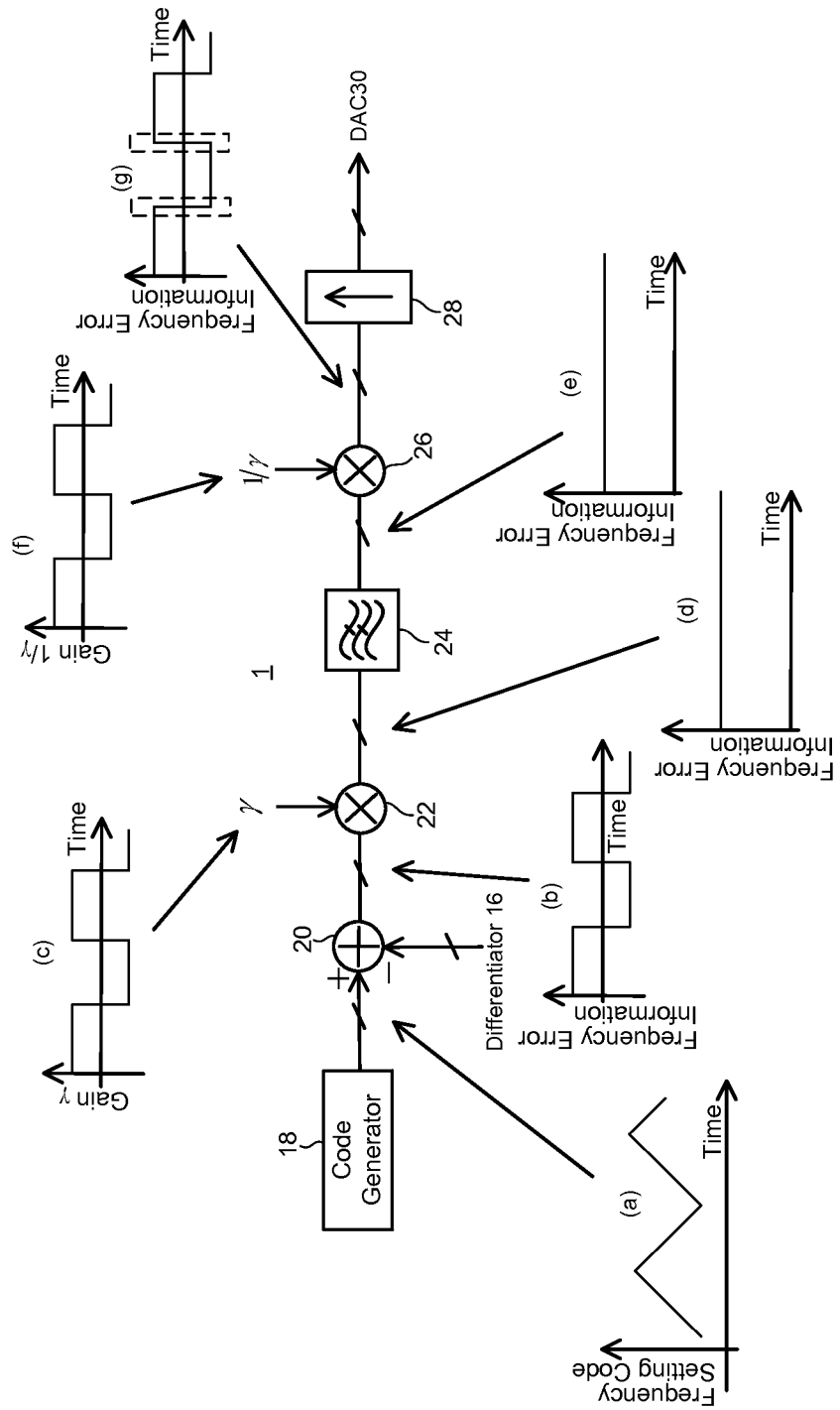
FIG. 5 is a diagram illustrating changes of frequency error information in the signal generation circuit of the first embodiment.

As illustrated in FIG. 5, in the signal generation circuit 1 of the first embodiment, the differentiator 19 (illustration omitted) and the multipliers 22 and 26 are provided. When the code generator 18 generates the frequency setting code in a triangular wave shape ((a) in the drawing), the comparator 20 outputs the frequency error information in a rectangular wave shape ((b) in the drawing). Here, when the multiplier 22 multiplies the frequency error information by the gain value ("1" or "−1" where the gain γ is 1) according to the slope of the frequency setting code ((c) in the drawing), a constant value is obtained as a result of the multiplication ((d) in the drawing). The constant value obtained in this manner is not affected by the transient response of the LPF 24, so that the element of the transient response by the LPF 24 can be eliminated ((e) in the drawing).

When the multiplier 26 multiplies the output of the LPF 24 by the inverse number ("1" or "−1" where the gain γ is "1") of the gain value ((f) in the drawing), the output of the multiplier 26 becomes frequency error information having the original rectangular wave shape without deterioration in increasing and decreasing ((g) in the drawing). In other words, by performing multiplication using the gain value according to the slope of the frequency setting code and the inverse number thereof before and after the LPF 24, the error information passing through the LPF 24 is converted into a constant value. This enables elimination of the effect of the transient response by the LPF 24.

Note that "1" is multiplied when the slope of the frequency setting code is positive and "−1" is multiplied when the slope of the frequency is negative in the example illustrated in FIG. 5, but the multiplication is not limited to this. The same effects can be achieved even if "1" is multiplied when the slope of the frequency setting code is negative and "−1" is multiplied when the slope of the frequency setting code is positive.

According to the signal generation circuit 1 of the first embodiment, the precise gain adjustment between two paths becomes unnecessary as compared with the conventional method in which correction of settling deterioration is performed in a feed-forward path, which is widely used for two-point modulation of an ADPLL. Therefore, even when the output of the VCO 10 has non-linearity, the frequency error can be made smaller to increase the frequency accuracy and the linearity of the frequency variation.

Further, according to the signal generation circuit of this embodiment, the calculation from the digital phase detector down to the current output DAC is realized by using digital circuits, thus eliminating the necessity of the passive elements such as a resistor and a capacitor in the calculation unit to improve the stability of the circuits and the FMCW signal. Further, since the error due to the element variation in the passive elements do not occur, the circuit size can be decreased and highly accurate calculation can be realized. Furthermore, according to the signal generation circuit of this embodiment, the control voltage is generated by the current output DAC and the integrator composed of the capacitor, thus making it possible to reduce the circuit size and the power consumption and provide an oscillation signal with suppressed distortion and with higher accuracy.

Second Embodiment

Next, a signal generation circuit 2 of a second embodiment will be described referring to FIG. 6. The signal generation circuit 2 of the second embodiment is made by adding selectors 42 and 44 to the output of the differentiator 19 in the signal generation circuit 1 of the first embodiment. In the following description, elements common to the first embodiment will be referred to with common numerals or letters, while omitting their overlapping descriptions.

Figure 6:
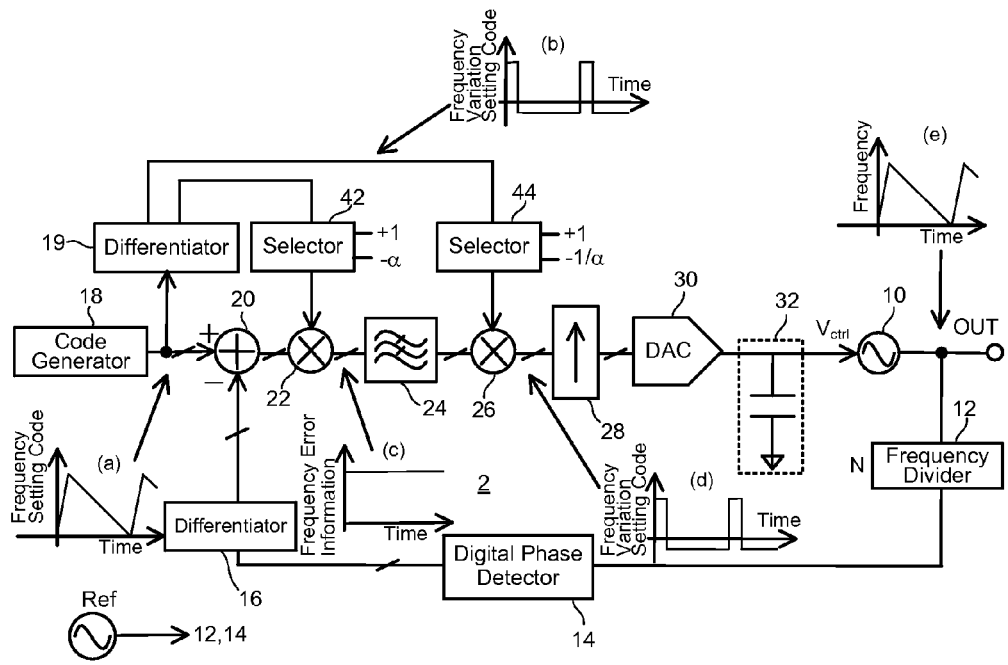
FIG. 6 is a block diagram illustrating a configuration of a signal generation circuit of a second embodiment.

As illustrated in FIG. 6, in the signal generation circuit 2 of the second embodiment, the selectors 42 and 44 are provided. The selectors 42 and 44 are configured to output specific values according to the polarities of the signal inputted therein (the gain value outputted from the differentiator 19 and the inverse number thereof). In other words, the selectors 42 and 44 correct the gain value according to positive/negative of the result of differentiation by the differentiator 19 and output gain values different between the increase time and the decrease time of the frequency. In the example illustrated in FIG. 6, when the differentiator 19 outputs "1" and "−1", the selector 42 converts them into "1" and "−α" (gain α=(slope to be multiplied by 1)/(slope to be multiplied by α)) and supplies "1" and "−α" to the multiplier 22. Similarly, when the differentiator 19 outputs "1" and "−1", the selector 44 converts them into "1" and "−1/α" and supplies "1" and "−1/α" to the multiplier 26.

As illustrated in FIG. 6, when the code generator 18 generates the frequency setting code in a "saw-tooth wave" shape in which the absolute value of the slope differs between the increase time and the decrease time of the frequency ((a) in the drawing), the differentiator 19 outputs a frequency variation setting code in which the pulse width and the amplitude differ between positive and negative ((b) in the drawing) This is because (the absolute value of) the slope of the frequency setting code differs between the time when the frequency increases and the time when the frequency decreases.

Hence, the selectors 42 and 44 are configured to output values corrected according to input of the gain value and the inverse number thereof so as to correct the difference in slope between the increase time and the decrease time of the frequency. For example, when the slope at the increase time of the frequency setting code is "1" and the slope at the decrease time of the frequency setting code is "−α", the selector 42 supplies "1" or "−α" to the multiplier 22 according to the slope of the frequency setting code. As a result of this, a constant value can be obtained as the result of the multiplication by the multiplier 22 ((c) in the drawing). The constant value thus obtained is not affected by the transient response of the LPF 24, so that the element of the transient response by the LPF 24 can be eliminated.

In this case, the selector 44 supplies "1" or "−1/α" to the multiplier 22 according to the slope of the frequency setting code. When the multiplier 26 multiplies the output of the LPF 24 by "1" or "−1/α" according to the inverse number of the slope of the frequency setting code, the output of the multiplier 26 becomes the original frequency error information ((d) in the drawing). In other words, even when the slope of the frequency setting code differs between the time when the frequency increases and the time when the frequency decreases, the error information passing through the LPF 24 can be converted into a constant value, so that the effect of the transient response by the LPF 24 can be eliminated.

Note that the selector 42 supplies "1" and "−α" to the multiplier 22 in the above example, but the configuration is not limited to the above. A value obtained by normalizing the positive slope of the frequency setting code by the negative slope may be made −α. More specifically, in the case where the selector 42 outputs "1" when the slope is positive and outputs "−α" when the slope is negative, the selector 44 outputs "1" when the slope is positive and outputs "−1/α" when the slope is negative. Alternatively, in the case where the selector 42 outputs "1" when the slope of the frequency setting code is negative and outputs "−α" when the slope is positive, the selector 44 outputs "1" when the slope of the frequency setting code is negative and outputs "−1/α" when the slope is positive In the signal generation circuit of this embodiment, even when the slope of the frequency setting code differs between the increase and the decrease of the frequency, the frequency error can be made smaller to increase the frequency accuracy and the linearity of the frequency variation.

Third Embodiment

Next, a signal generation circuit 3 of a third embodiment will be described referring to FIG. 7 to FIG. 9. The signal generation circuit 3 of the third embodiment is made by adding a delay device 52 to one of the outputs of the differentiator 19 in the signal generation circuit 1 of the first embodiment. In the following description, elements common to the first embodiment will be referred to with common numerals or letters, while omitting their overlapping descriptions.

Figure 7:
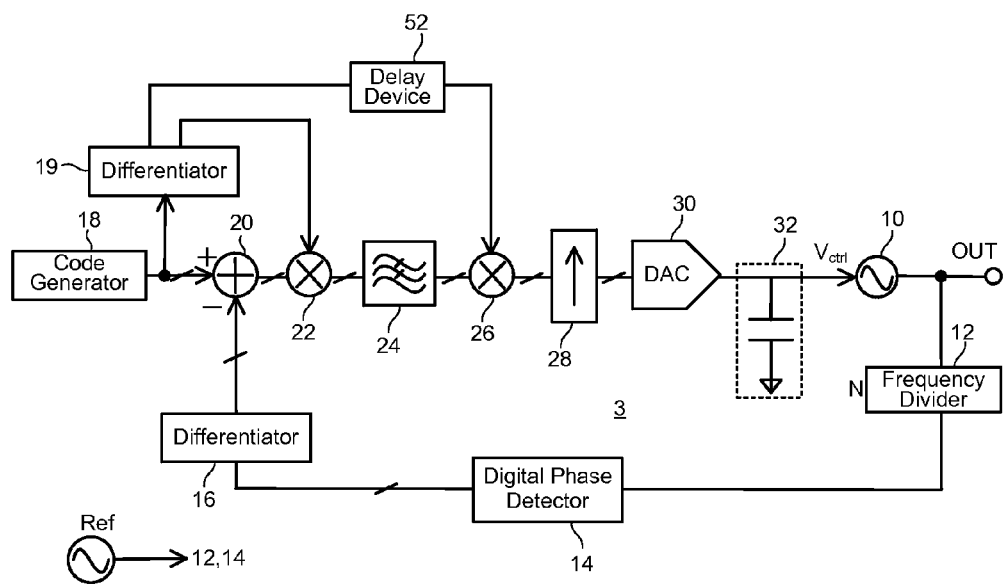
FIG. 7 is a block diagram illustrating a configuration of a signal generation circuit of a third embodiment.

As illustrated in FIG. 7, the delay device 52 is arranged between one of the outputs of the differentiator 19 and the multiplier 26 in the signal generation circuit 3 of the third embodiment. The delay device 52 delays the inverse number value of the gain value outputted from the differentiator 19 by a predetermined time period and supplies the delayed inverse number value of the gain value to the multiplier 26. In other words, the delay device 52 can adjust the timing to supply the gain value outputted from the differentiator 19 to the multiplier 22 and the timing to supply the inverse number of the gain value to the multiplier 26.

Operation of Third Embodiment

Subsequently, the operation of the signal generation circuit 3 of the third embodiment will be described referring to FIG. 8 and FIG. 9. FIG. 8 illustrates the signal waveform in the signal generation circuit 1 of the first embodiment, and FIG. 9 illustrates the signal waveform in the signal generation circuit 3 of the third embodiment.

Figure 8:
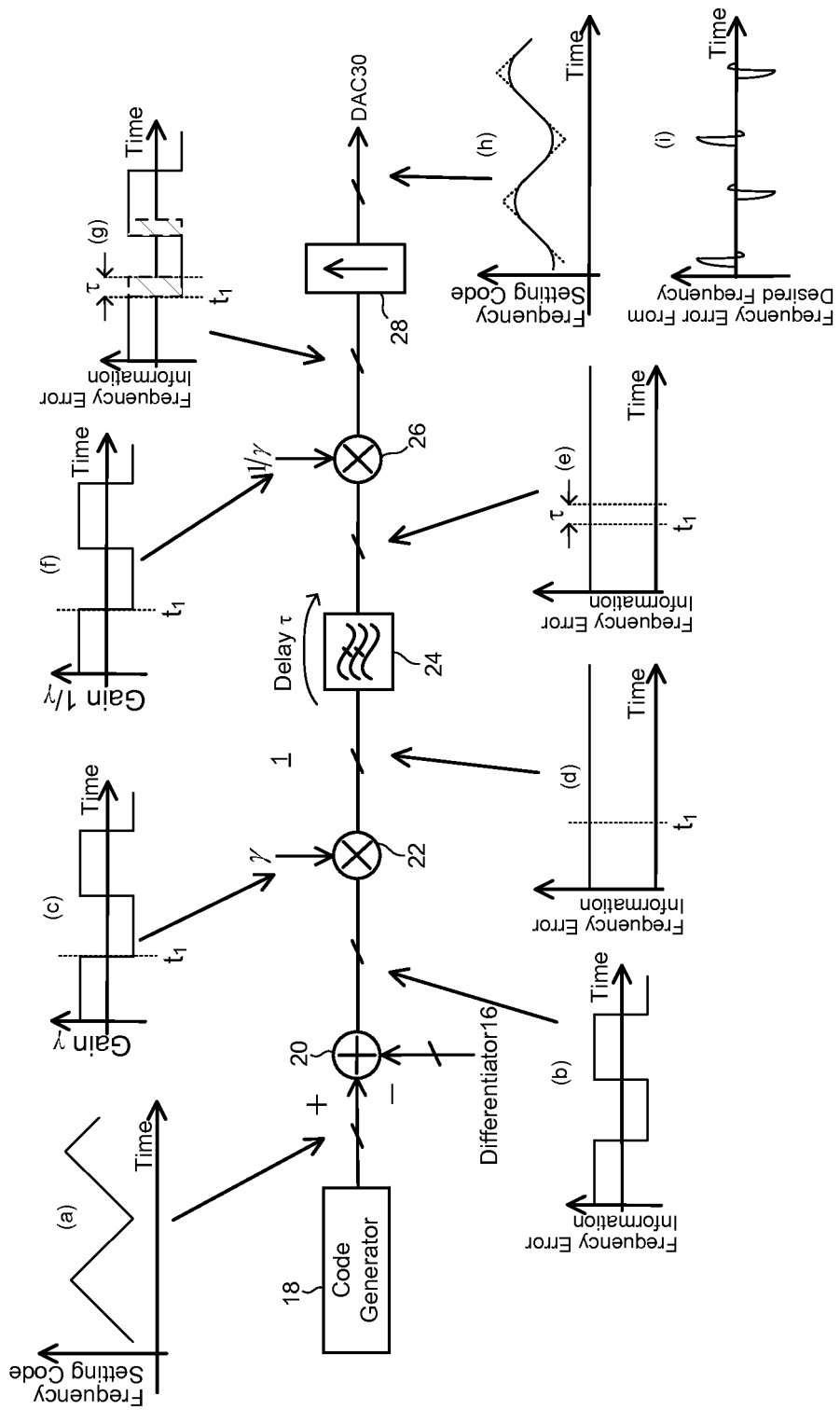
FIG. 8 is a diagram illustrating a calculation delay of a digital filter.

As illustrated in FIG. 8, it is assumed that a delay τ of the LPF 24 in the signal generation circuit 1 has a magnitude which cannot be ignored. When the code generator 18 generates the frequency setting code in a triangular wave shape ((a) in the drawing), the comparator 20 outputs the frequency error information in a rectangular wave shape ((b) in the drawing). When the multiplier 22 multiplies the frequency error information by the gain value (for example, "1" or "−1") outputted from the differentiator 19 ((c) in the drawing), a constant value is obtained as a result of the multiplication ((d) in the drawing). However, since the LPF 24 generates the delay τ in a signal passing therethrough, the frequency error information inputted into the multiplier 26 is delayed from time t1 by the delay τ ((e) in the drawing).

The multiplier 26 needs to restore the frequency error information converted to the constant value by the multiplier 22 to the frequency error information in the original waveform in order to obtain a correct desired frequency. In other words, the multiplier 26 needs to multiply the frequency error information, which has been multiplied by "1" in the multiplier 22, by "1" and multiplies the frequency error information, which has been multiplied by "−1" in the multiplier 22, by "−1" ((f) in the drawing). However, when the delay τ is generated in the calculation in the LPF 24, the multiplication timing by the multiplier 26 is shifted. For example, such a situation may occur that the multiplier 26 multiplies the frequency error information, which has been multiplied by "1" in the multiplier 22, by "−1" and multiplies the frequency error information, which has been multiplied by "−1" in the multiplier 22, by "1" ((g) in the drawing). In this case, wrong frequency error information is supplied to the current output DAC 30, resulting in an increase of frequency error in a delay time period ((h) (i) in the drawing). Further, when a delay is included in the calculation in the LPF 24, the gain (1/γ) of a small-signal transfer characteristic illustrated in FIG. 2 becomes $(1/\gamma)e^{-s\tau}$, bringing about a problem in which the loop characteristics vary between the design value and the actual PLL.

Figure 9:
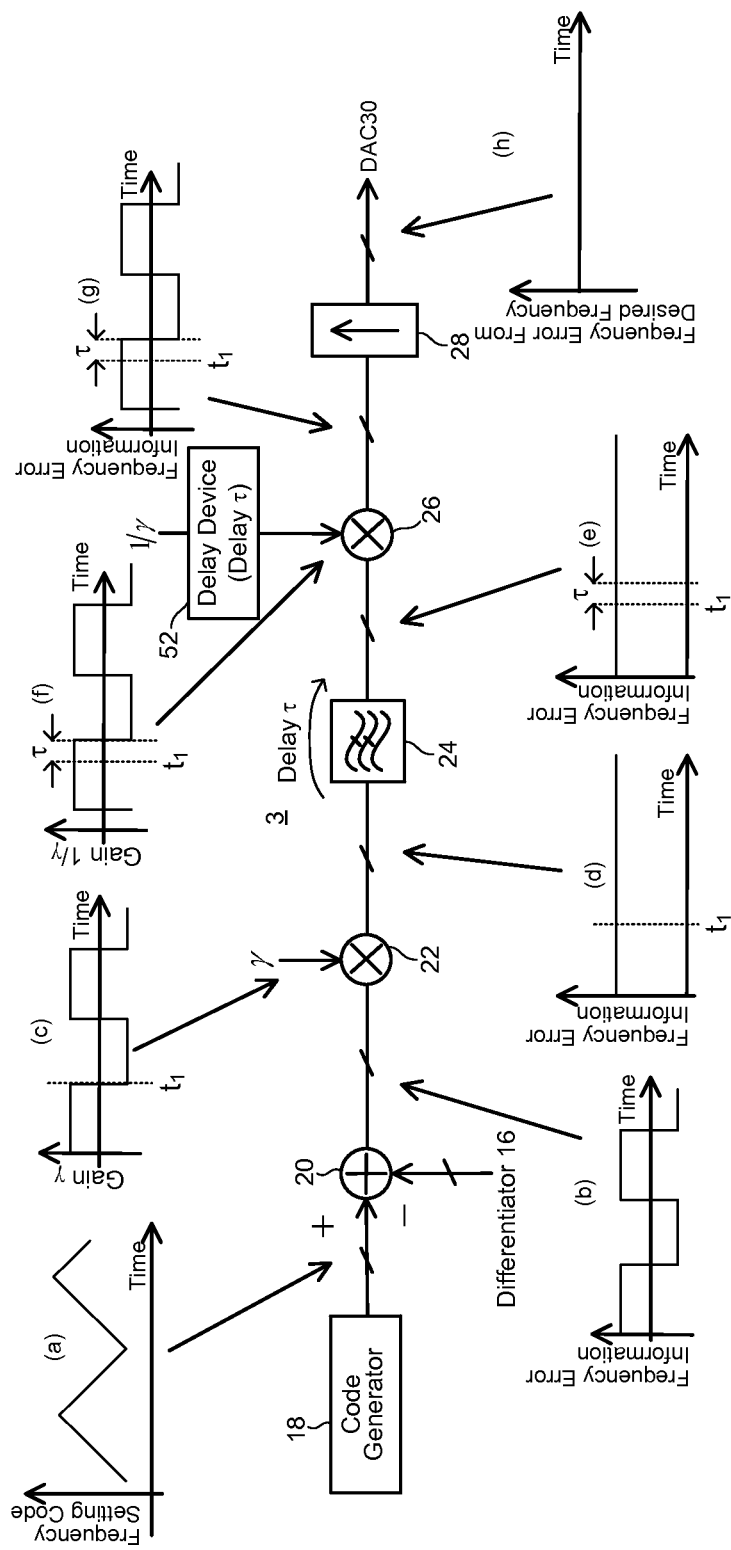
FIG. 9 is a block diagram illustrating a principle configuration of the signal generation circuit of the third embodiment.

On the other hand, in the signal generation circuit 3 of the third embodiment, the timing to multiply by the inverse number of the gain value in the multiplier 26 can be adjusted by providing the delay device 52 as illustrated in FIG. 9. When the code generator 18 generates the frequency setting code in a triangular wave shape ((a) in the drawing), the comparator 20 outputs the frequency error information in a rectangular wave shape ((b) in the drawing). Here, when the multiplier 22 multiplies the frequency error information by the signal (for example, "1" or "−1") according to the slope of the frequency setting code ((c) in the drawing), a constant value is obtained as a result of the multiplication ((d) in the drawing). Since the LPF 24 generates the delay τ in a signal passing therethrough, the frequency error information inputted into the multiplier 26 is delayed from time t1 by the delay τ ((e) in the drawing).

The delay device 52 delays the inverse number of the gain value by the delay τ and supplies the delayed inverse number of the gain value to the multiplier 26 ((f) in the drawing). As a result of this, the multiplication timing of the inverse number of the gain value by the multiplier 26 correctly coincides with the multiplication timing of the gain value by the multiplier 22 ((g) in the drawing), so that the frequency error can be reduced ((h) in the drawing).

In other words, since the multiplier 26 performs multiplication processing at the timing that is delayed by the same time period as that of the delay τ generated in the calculation in the LPF 24, the frequency error caused by the delay of the LPF 24 can be reduced and the loop characteristics at the design time can be obtained. In short, the frequency error can be made smaller to increase the frequency accuracy and the linearity of the frequency variation.

Fourth Embodiment

Next, a signal generation circuit 4 of a fourth embodiment will be described referring to FIG. 10. The signal generation circuit 4 of the fourth embodiment is made by combining the delay device 52 in the signal generation circuit 3 of the third embodiment to one of the outputs of the differentiator 19 in the signal generation circuit 2 of the second embodiment. Hereinafter, elements common to the second and third embodiments will be referred to with common numerals or letters, while omitting their overlapping descriptions.

Figure 10:
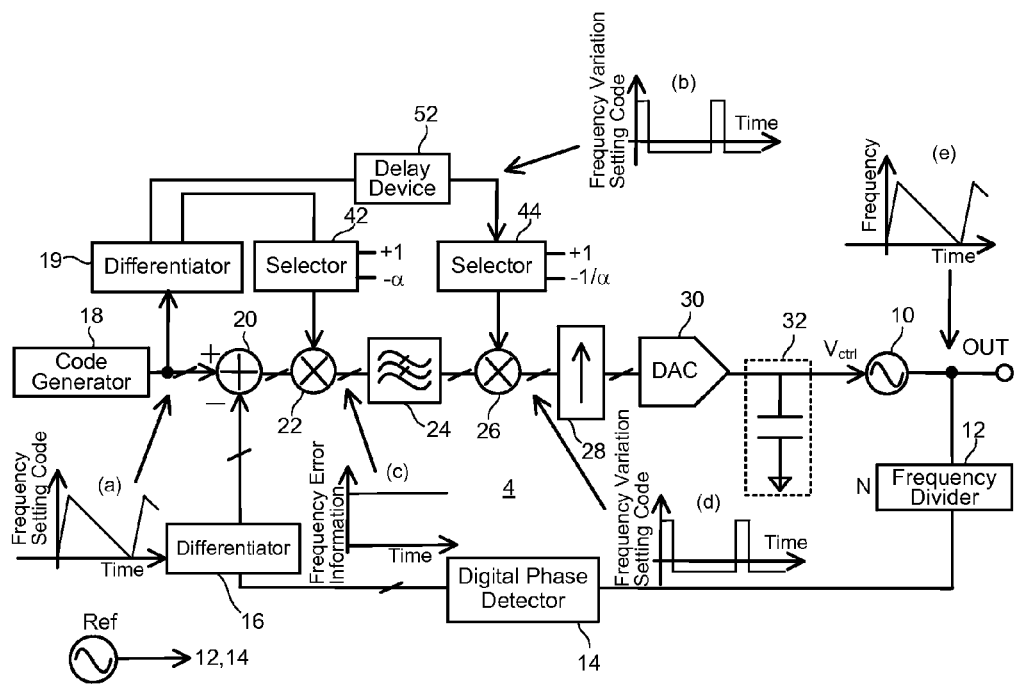
FIG. 10 is a block diagram illustrating a configuration of a signal generation circuit of a fourth embodiment.

As illustrated in FIG. 10, the delay device 52 is arranged between one of the outputs of the differentiator 19 and the selector 44 in the signal generation circuit 4 of the fourth embodiment. The delay device 52 delays the inverse number of the gain value outputted from the differentiator 19 by a predetermined time period and supplies the delayed inverse number value of the gain value to the selector 44. In other words, the delay device 52 can adjust the timing to supply the gain value outputted from the differentiator 19 to the selector 42 and the timing to supply the inverse number of the gain value to the selector 44.

In the signal generation circuit of this embodiment, as similar to the third embodiment, even when the slope of the frequency setting code differs between the increase time and the decrease time of the frequency, the frequency error caused by the delay of the LPF 24 can be made smaller to obtain the loop characteristics at the design time. In short, the frequency error can be made smaller to increase the frequency accuracy and the linearity of the frequency variation.

Fifth Embodiment

Next, a signal generation circuit 5 of a fifth embodiment will be described referring to FIG. 11 to FIG. 13. The signal generation circuit 5 of the fifth embodiment is made by further providing a holding unit 62 and an adder 64 at the previous stage of the current output DAC 30 in the signal generation circuit 3 of the third embodiment. In the following description, elements common to the third embodiment will be referred to with common numerals or letters, while omitting their overlapping descriptions.

Figure 11:
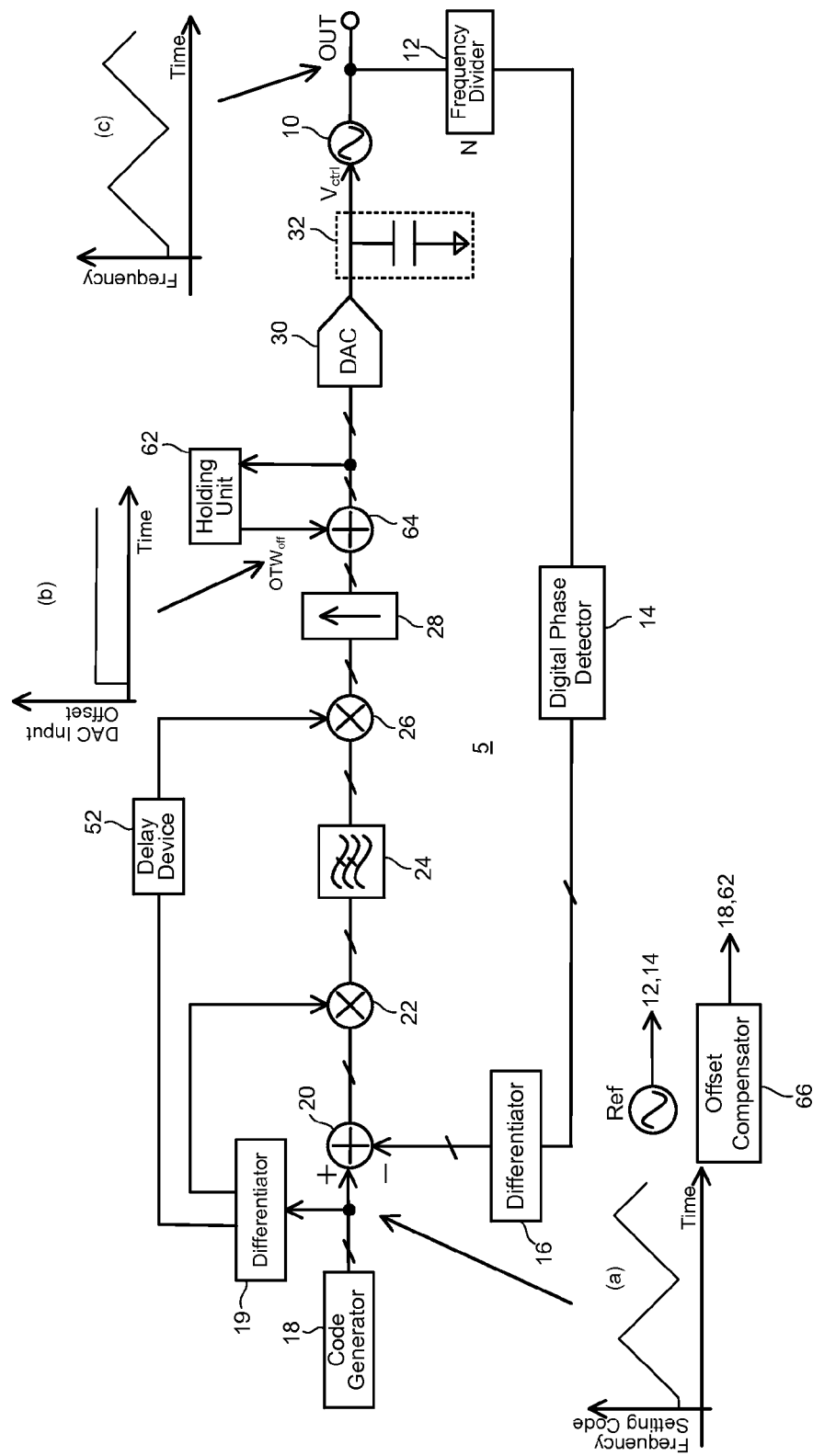
FIG. 11 is a block diagram illustrating a configuration of a signal generation circuit of a fifth embodiment.

As illustrated in FIG. 11, the signal generation circuit 5 of the fifth embodiment includes the holding unit 62, the adder 64, and an offset compensator 66. The holding unit 62 holds an input code which will be supplied to the current output DAC 30 in a state locked to a fixed frequency before start of the FMCW modulation. The adder 64 adds data held by the holding unit 62 and the output of the variable gain amplifier 28 (or the multiplier 26). The offset compensator 66 controls the code holding by the holding unit 62.

In an initial operation of the signal generation circuit 5 of the fifth embodiment, the offset compensator 66 controls the code generator 18 to generate a constant code so that the current output DAC 30 oscillates at a constant frequency. Thereafter, the oscillation frequency of the VCO 10 is locked by the PLL loop of the signal generation circuit 5. In this event, the offset compensator 66 causes the holding unit 62 to hold the code supplied to the current output DAC 30.

After the holding unit 62 holds the code, the offset compensator 66 controls the code generator 18 to generate the frequency setting code, for example, in a triangular wave shape so that the VCO 10 generates a predetermined FMCW signal. Thereafter, the holding unit 62 functions as a read-only memory, and the adder 64 adds the data held by the holding unit 62 to the input code into the current output DAC 30 to thereby compensate the offset.

The offset compensator may operate as follows to calculate the offset. In the initial operation of the signal generation circuit 5 of the fifth embodiment, the offset compensator 66 controls the code generator 18 to output a triangular wave in which the absolute values of slope are equal. Thereafter, the oscillation frequency of the VCO 10 is locked by the PLL loop of the signal generation circuit 5, and the VCO 10 outputs the triangular wave.

Thereafter, the offset compensator 66 causes the holding unit 62 to hold the code supplied to the current output DAC 30 when the slope is positive and the code supplied to the current output DAC 30 when the slope is negative. The offset compensator 66 calculates the average value of the two codes inputted into the holding unit 62 and causes the holding unit 62 to hold the obtained offset. Thereafter, the holding unit 62 functions as a read-only memory, and the adder 64 adds the data held by the holding unit 62 to the input code into the current output DAC 30 to thereby compensate the offset.

Operation of Fifth Embodiment

The operation of the signal generation circuit 5 of the fifth embodiment will be described referring to FIG. 12 and FIG. 13. FIG. 12 illustrates an example in which two current sources $I_{up}$ and $I_{dn}$ are combined in series as the current output DAC 30. More specifically, when "+1" is inputted into the current output DAC 30, the current source $I_{up}$ of the current output DAC 30 functions to pass current out, and when "−1" is inputted, the current source $I_{dn}$ of the current output DAC 30 functions to draw current out.

Figure 12:
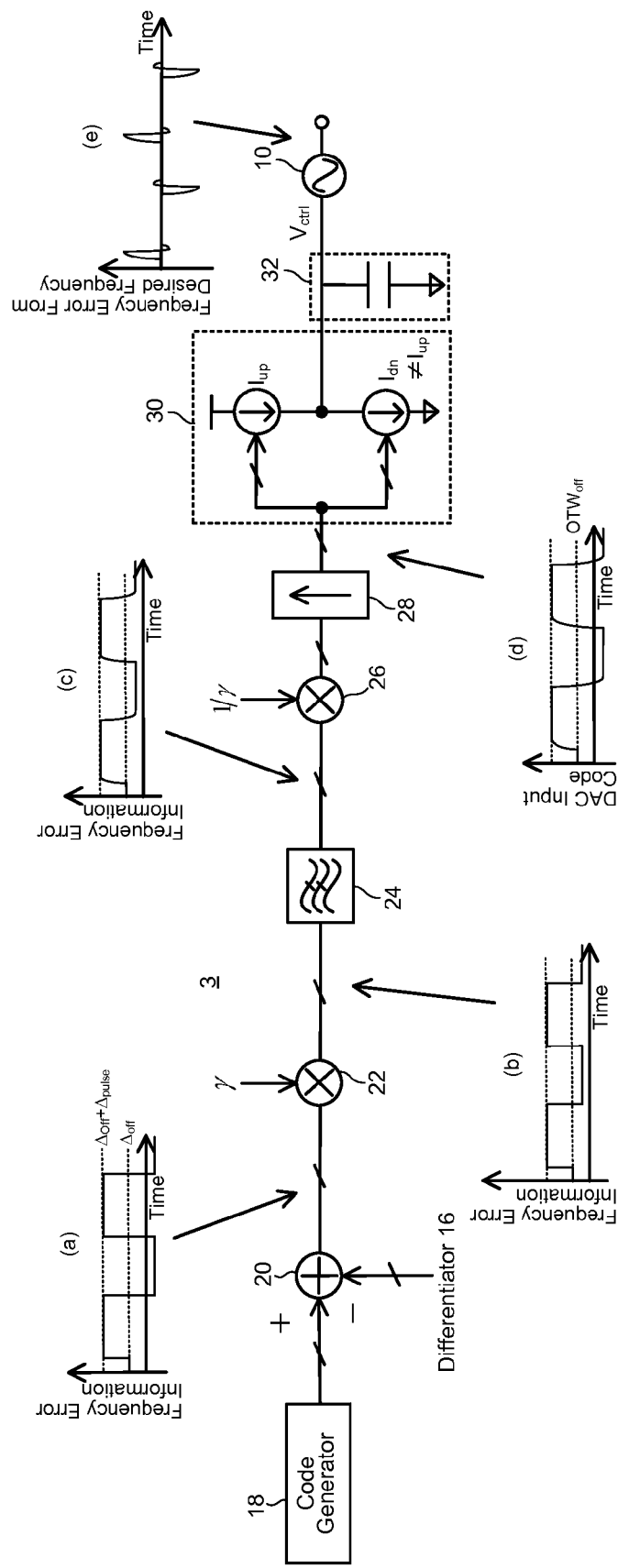
FIG. 12 is a diagram illustrating an offset due to a mismatch between current sources of a DAC.

In the signal generation circuit 3 of the third embodiment illustrated in FIG. 12, in the case where there is an offset in the frequency error information because of a mismatch between the current sources of the current output DAC 30, it is impossible to fix the signal passing through the LPF 24 to a fixed value because of an offset even if the multipliers are inserted before and after the LPF 24, failing to suppress the settling delay.

It is assumed here that there is a mismatch between the current source $I_{up}$ passing current out to the integrator 32 and the current source $I_{dn}$ drawing current out of the integrator 32 in the current output DAC 30. In other words, it is assumed that a difference occurs between the absolute value of the current passed out from the current source $I_{up}$ and the absolute value of the current drawn out by the current source $I_{dn}$. In this case, the current output DAC 30 does not pass current to the integrator 32 when the oscillation frequency is locked to a fixed frequency, an offset of $OTW_{off}$ occurs in the input code to the current output DAC 30.

Then, an off set $\Delta_{off}$ occurs also in the frequency error signal outputted from the comparator 20, so that the frequency error information when subjected to the FMCW modulation is in a rectangular wave shape taking values $\Delta_{off}+\Delta_{pulse}$ and $\Delta_{off}-\Delta_{pulse}$ around $\Delta_{off}$ ((a) in the drawing). In this case, even if the frequency error information is multiplied by the gain value outputted from the differentiator 19 by the multiplier 22, the frequency error information inputted into the LPF 24 does not takes a constant value any longer due to the offset $\Delta_{off}$ in the frequency error information ((b) in the drawing). This causes the LPF 24 to generate a settling delay ((c) (d) in the drawing), resulting in a larger output frequency error ((e) in the drawing).

As described above, if an offset occurs in the input code to the current output DAC 30, the effect to suppress the settling delay by the combination of the multipliers 22 and 26 decreases.

Figure 13:
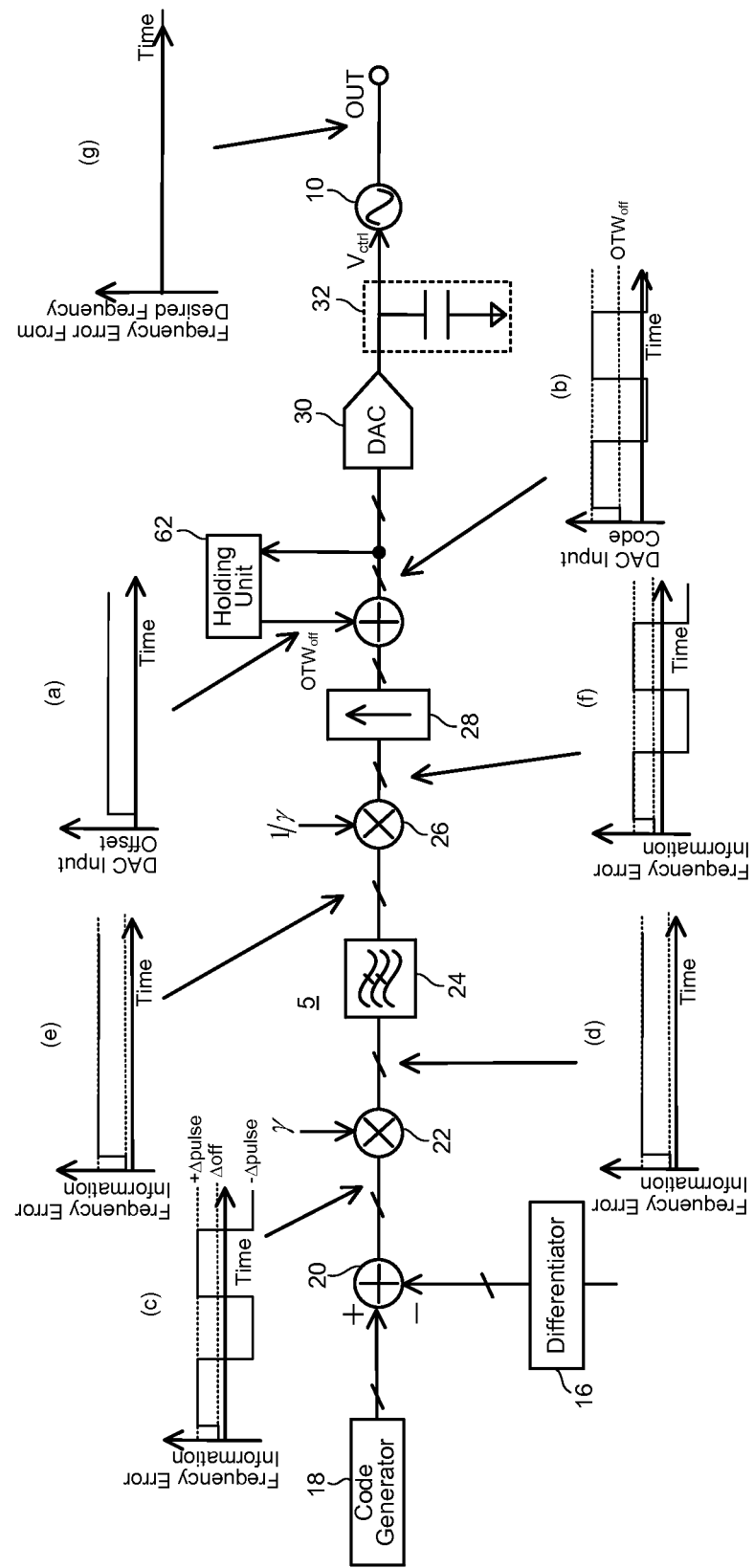
FIG. 13 is a block diagram illustrating a principle configuration of the signal generation circuit of the fifth embodiment.

Hence, the holding unit 62 holding the input code supplied to the current output DAC 30 is provided in the signal generation circuit 5 of the fifth embodiment to enable the offset compensation as illustrated in FIG. 13.

In the initial operation of the signal generation circuit 5 of the fifth embodiment, the code generator 18 generates a constant code for the current output DAC 30 to oscillate at a constant frequency. Thereafter, the oscillation frequency of the VCO 10 is locked by the PLL loop of the signal generation circuit 5, and in this event, the holding unit 62 holding "0" in advance as an initial value holds the code supplied to the current output DAC 30. In other words, when there is a mismatch between the current source $I_{up}$ and the current source $I_{dn}$ in the current output DAC 30, the offset of $OTW_{off}$ occurs in the input code to the current output DAC 30, and the holding unit 62 holds this offset $OTW_{off}$.

At the initial stage, the offset $\Delta_{off}$ occurs in the frequency error signal outputted from the comparator 20. However, when the adder 64 adds the code held by the holding unit 62 ((a) in the drawing) to the input of the current output DAC 30 ((b) in the drawing), the offset contained in the frequency error information to be inputted into the LPF 24 is compensated ((c) in the drawing), so that the frequency error information inputted into the LPF 24 becomes a constant value ((d) in the drawing). Therefore, the LPF 24 never generates the settling delay ((e) in the drawing), so that the frequency error information in a correct rectangular wave shape can be obtained even after the inverse number of the slope of the frequency setting code is multiplied ((f) in the drawing). As a result, the output frequency error can be suppressed ((g) in the drawing).

When the PLL of the circuit is locked, the offset $\Delta_{off}$ in the frequency error information can be finally made "0".

According to the signal generation circuit 5 of the fifth embodiment, even when there is a mismatch between the current sources of the current output DAC 30, the multipliers 22 and 26 inserted at the previous and subsequent stages of the LPF 24 can be made to effectively function to prevent the deterioration in settling due to the LPF 24 to thereby suppress the frequency error as described above. In other words, the frequency error can be made smaller to increase the frequency accuracy and the linearity of the frequency variation. Note that in the above-described example, the holding unit 62 and the adder 64 are added to the signal generation circuit 3 of the third embodiment, but the configuration is not limited to this. The same effects can be achieved even if the holding unit 62 and the adder 64 are added to the signal generation circuit 1 of the first embodiment.

Sixth Embodiment

Figure 14:
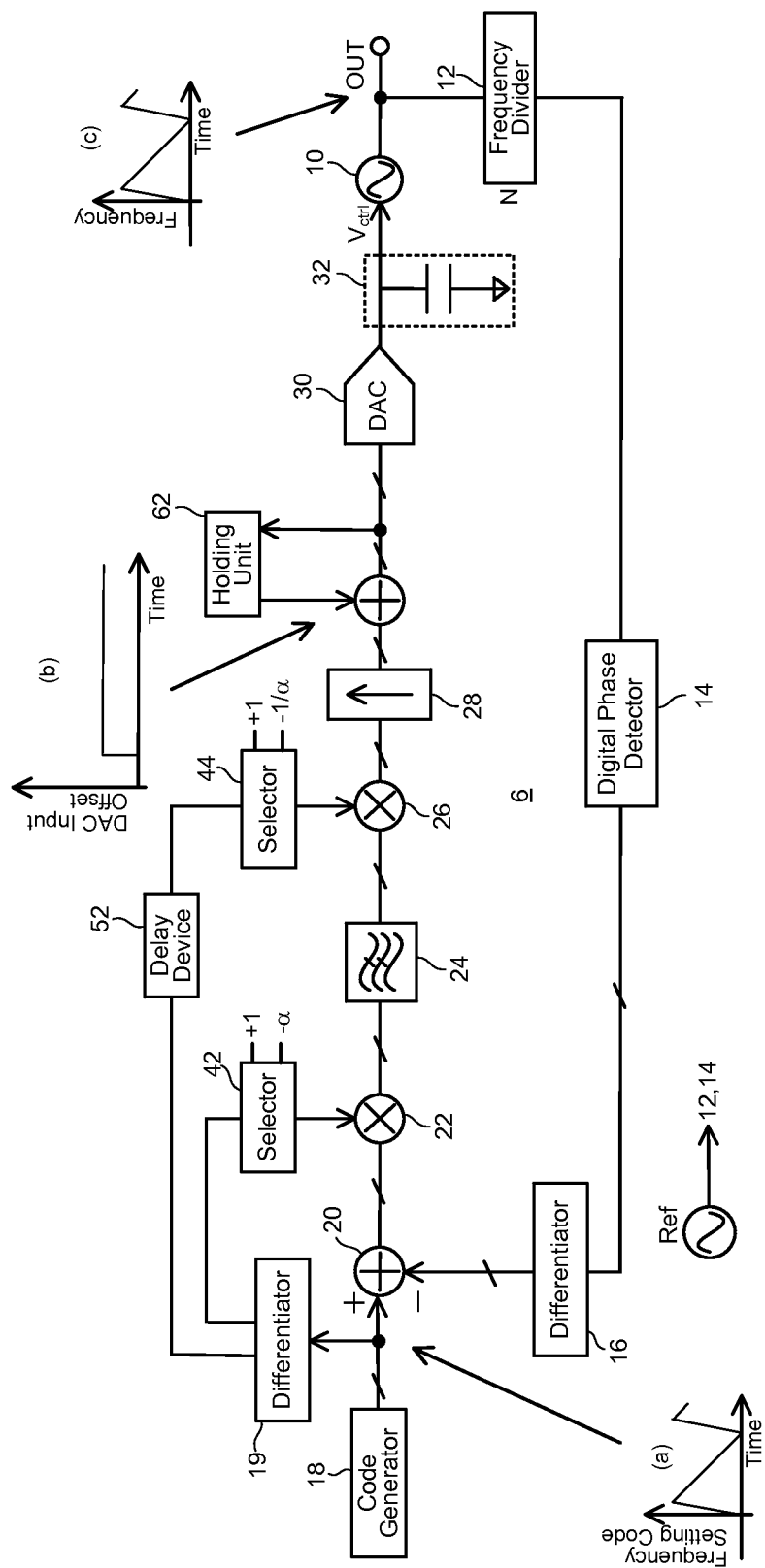
FIG. 14 is a block diagram illustrating a configuration of a signal generation circuit of a sixth embodiment.

Next, a signal generation circuit 6 of a sixth embodiment will be described referring to FIG. 14. The signal generation circuit 6 of the sixth embodiment is made by combining the holding unit 62 and the adder 64 in the signal generation circuit 5 of the fifth embodiment to the signal generation circuit 4 of the fourth embodiment. In the following description, elements common to the fourth and fifth embodiments will be referred to with common numerals or letters, while omitting their overlapping descriptions.

In the signal generation circuit of this embodiment, even when there is a mismatch between the current sources of the current output DAC 30 in the case where the slope of the frequency setting code differs between the increase and the decrease of the frequency, the multipliers 22 and 26 inserted at the previous and subsequent stages of the LPF 24 can be made to effectively function to prevent the deterioration in settling due to the LPF 24 to thereby suppress the frequency error. In other words, the frequency error can be made smaller to increase the frequency accuracy and the linearity of the frequency variation. Note that in the above-described example, the holding unit 62 and the adder 64 are added to the signal generation circuit 4 of the fourth embodiment, but the configuration is not limited to this. The same effects can be achieved even if the holding unit 62 and the adder 64 are added to the signal generation circuit 2 of the second embodiment.

Seventh Embodiment

Next, a radar device according to a seventh embodiment will be described referring to FIG. 15. The radar device according to this embodiment uses the signal generation circuit 1 to 6 according to the first to six embodiment. Hence, elements common to the first to six embodiments will be referred to with common numerals or letters, while omitting their overlapping descriptions.

Figure 15:
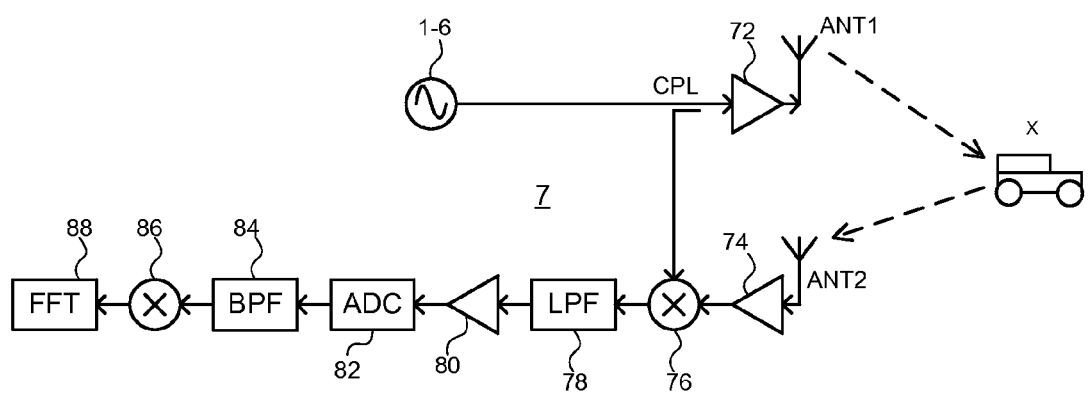
FIG. 15 is a block diagram illustrating a configuration of a radar device of a seventh embodiment.

As illustrated in FIG. 15, a radar device 7 according to this embodiment includes a signal generation circuit 1-6 according to the first to six embodiment, a power amplifier 72, a transmission antenna ANT1, a reception antenna ANT2, a high-frequency amplifier 74, a coupler CPL, a mixer 76, a low-pass filter 78, an amplifier 80, an A/D converter 82 (ADC 82), a band-pass filter 84 (BPF 84), a frequency converter 86, and a Fourier transformer 88.

The power amplifier 72 is a transmitting amplifier amplifying the oscillation signal of the signal generation circuit 1-6 up to a predetermined power. The transmission antenna ANT1 radiates a high-frequency signal amplified by the power amplifier 72 to a space. The reception antenna ANT2 receives a reflection signal that is the signal transmitted from the transmission antenna ANT1 and reflected by a search (or measurement) object X of the radar device 7.

The high-frequency amplifier 74 amplifies the reflection signal received by the reception antenna ANT2 up to a predetermined level. It is preferable to use, for example, an amplifier suitable for a high frequency such as an LNA (Low Noise Amplifier) as the high-frequency amplifier 74. The coupler CPL branches off the output signal from the signal generation circuit 1-6 (at the previous stage of the input of the power amplifier 72). Note that in place of the coupler CPL, the output from the signal generation circuit 1-6 may be directly branched off.

The mixer 76 multiplies the reflection signal amplified by the high-frequency amplifier 74 and the oscillation signal branched off by the coupler CPL together. Where the frequency of the reflection signal is fr and the frequency of the oscillation signal is ft, the mixer 76 outputs signals of fr+ft and |fr−ft|. The low-pass filter 78 transmits only a beat signal of the frequency of |fr−ft| among the outputs of the mixer 76. In addition, the low-pass filter 78 also acts to remove signals of a folding frequency of the A/D conversion at the subsequent stage or higher. The amplifier 80 amplifies the beat signal up to a level required for the analog-digital conversion at the subsequent stage.

The ADC 82 A/D-converts the beat signal amplified by the amplifier 80. The BPF 84 digitally removes the noise component of a flicker noise and digitally removes the high-frequency component which could not be removed by the low-pass filter 78 at the analog stage. As a result, the BPF 84 will takes out only the signal component of the beat signal.

The frequency converter 86 converts the signal component of the obtained beat signal into a frequency suitable for Fourier transformation. The Fourier transformer 88 performs calculation to calculate the time difference between the transmitted oscillation signal and the received reflection signal from the signal component of the beat signal to calculate the distance to the search object.

According to this embodiment, since the signal generation circuit according to the first to sixth embodiment is used, a radar device using the FMCW signal with low noise, high frequency accuracy and high linearity can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal generator, comprising:
an oscillator configured to generate an oscillation signal controlled in oscillation frequency by an analog control signal;
a digital phase detector configured to detect phase information of the oscillation signal and to output digital phase information;
a first differentiator configured to differentiate the digital phase information and to output digital frequency information;
a comparator configured to compare a frequency setting code used for setting the oscillation frequency with the digital frequency information and to output digital frequency error information;
a second differentiator configured to differentiate the frequency setting code and to generate a gain value corresponding to a slope of the frequency setting code and an inverse number of the gain value;
a first multiplier configured to multiply the digital frequency error information outputted from the comparator by the gain value;
a low-pass filter configured to remove a high frequency component in a result of multiplication by the first multiplier;
a second multiplier configured to multiply an output of the low-pass filter unit by the inverse number of the gain value;
a D/A converter configured to convert a result of multiplication by the second multiplier into analog frequency error information; and
an integrator configured to integrate the analog frequency error information so as to convert the analog frequency error information into analog phase error information and to output the analog phase error information as the analog control signal.

2. The signal generator of claim 1, further comprising
a delay unit configured to delay the inverse number of the gain value by a predetermined time period,
wherein the second multiplier multiplies the output of the low-pass filter by the inverse number of the gain value delayed by the delay unit.

3. A radar device, comprising:
the signal generator of claim 2;
a transmitter configured to transmit the oscillation signal as a transmission signal;
a mixer configured to multiply a reception signal from a search object and the transmission signal so as to generate a beat signal, the reception signal being a reflected transmission signal reflected on the search object after being transmitted by the transmitter as the transmission signal; and
a calculator configured to calculate the beat signal to generate distance data to the search object.

4. The signal generator of claim 1, further comprising:
a holding unit configured to hold a compensation value corresponding to an offset of an output with respect to an input of the D/A converter; and
an adder configured to add the compensation value held by the holding unit to a result of multiplication by the second multiplier.

5. The signal generator of claim 4,
wherein the D/A converter includes a first current source passing an output current out and a second current source drawing the output current in; and
wherein the offset of the output with respect to the input of the D/A converter is a difference between an absolute value of the current passed out by the first current source and an absolute value of the current drawn in by the second current source.

6. A radar device, comprising:
the signal generator of claim 5;
a transmitter configured to transmit the oscillation signal as a transmission signal;
a mixer configured to multiply a reception signal from a search object and the transmission signal so as to generate a beat signal, the reception signal being a reflected transmission signal reflected on the search object after being transmitted by the transmitter as the transmission signal; and
a calculator configured to calculate the beat signal to generate distance data to the search object.

7. A radar device, comprising:
the signal generator of claim 4;
a transmitter configured to transmit the oscillation signal as a transmission signal;
a mixer configured to multiply a reception signal from a search object and the transmission signal so as to generate a beat signal, the reception signal being a reflected transmission signal reflected on the search object after being transmitted by the transmitter as the transmission signal; and
a calculator configured to calculate the beat signal to generate distance data to the search object.

8. The signal generator of claim 1, further comprising:
a code generator configured to generate the frequency setting code and to input the frequency setting code into the comparator.

9. A radar device, comprising:
the signal generator of claim 8;
a transmitter configured to transmit the oscillation signal as a transmission signal;
a mixer configured to multiply a reception signal from a search object and the transmission signal so as to generate a beat signal, the reception signal being a reflected transmission signal reflected on the search object after transmitted by the transmitter as the transmission signal; and a calculator configured to calculate the beat signal to generate distance data to the search object.

10. The signal generator of claim 1, further comprising a gain correction unit configured to correct the gain value according to a result of differentiation by the second differentiator.

11. A radar device, comprising:
the signal generator of claim 10;
a transmitter configured to transmit the oscillation signal as a transmission signal;
a mixer configured to multiply a reception signal from a search object and the transmission signal so as to generate a beat signal, the reception signal being a reflected transmission signal reflected on the search object after transmitted by the transmitter as the transmission signal; and
a calculator configured to calculate the beat signal to generate distance data to the search object.

12. A radar device, comprising:
the signal generator of claim 1;
a transmitter configured to transmit the oscillation signal as a transmission signal;
a mixer configured to multiply a reception signal from a search object and the transmission signal so as to generate a beat signal, the reception signal being a reflected transmission signal reflected on the search object after being transmitted by the transmitter as the transmission signal; and
a calculator configured to calculate the beat signal so as to generate distance data to the search object.

13. The signal generator of claim 1, wherein the oscillator linearly increases and decreases the oscillation frequency with respect to time according to the analog control signal.

14. An oscillator, comprising:
an oscillating unit configured to generate an oscillation signal controlled in oscillation frequency by an analog control signal;
a frequency divider configured to divide the oscillation frequency of the oscillation signal by a predetermined frequency division ratio;
a digital phase detector configured to detect phase information of a signal having a frequency divided by the frequency divider and to output digital phase information;
a first differentiator configured to differentiate the digital phase information and to output digital frequency information;
a comparator configured to compare a frequency setting code used for setting the oscillation frequency with the digital frequency information and to output digital frequency error information;
a second differentiator configured to differentiate the frequency setting code and to generate a gain value corresponding to a slope of the frequency setting code and an inverse number of the gain value;

a first multiplier configured to multiply the digital frequency error information outputted from the comparator by the gain value;
a low-pass filter configured to remove a high frequency component in a result of multiplication by the first multiplier;
a second multiplier configured to multiply an output of the low-pass filter unit by the inverse number of the gain value;
a D/A converter configured to convert a result of multiplication by the second multiplier into analog frequency error information;
an integrator configured to integrate the analog frequency error information so as to convert the analog frequency error information into analog phase error information and to output the analog phase error information as the analog control signal; and
a reference signal oscillating unit configured to supply a predetermined reference signal to the frequency divider and the digital phase detector.

15. The oscillator of claim 14, further comprising a delay unit configured to delay the inverse number of the gain value by a predetermined time period,
wherein the second multiplier multiplies the output of the low-pass filter by the inverse number of the gain value delayed by the delay unit.

16. The oscillator of claim 14, further comprising:
a holding unit configured to hold a compensation value corresponding to an offset of an output with respect to an input of the D/A converter; and
an adder configured to add the compensation value held by the holding unit to a result of multiplication by the second multiplier.

17. The oscillator of claim 16,
wherein the D/A converter includes a first current source passing an output current out and a second current source drawing the output current in; and
wherein the offset of the output with respect to the input of the D/A converter is a difference between an absolute value of the current passed out by the first current source and an absolute value of the current drawn in by the second current source.

18. The oscillator of claim 14, further comprising
a code generator configured to generate the frequency setting code and to input the frequency setting code into the comparator.

19. The oscillator of claim 14, further comprising
a gain correction unit configured to correct the gain value according to of a result of differentiation by the second differentiator.

20. The oscillator of claim 14, wherein the oscillating unit linearly increases and decreases the oscillation frequency with respect to time according to the analog control signal.

* * * * *